(12) United States Patent
McTigue

(10) Patent No.: US 6,806,697 B2
(45) Date of Patent: Oct. 19, 2004

(54) APPARATUS AND METHOD FOR CANCELING DC ERRORS AND NOISE GENERATED BY GROUND SHIELD CURRENT IN A PROBE

(75) Inventor: Michael T. McTigue, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 26 days.

(21) Appl. No.: 10/117,653

(22) Filed: Apr. 5, 2002

(65) Prior Publication Data

US 2003/0189422 A1 Oct. 9, 2003

(51) Int. Cl.[7] ........................... G01R 31/02; G01R 1/06
(52) U.S. Cl. ........................ 324/72.5; 324/149; 324/688
(58) Field of Search ........................... 324/72.5, 98, 99, 324/100, 555, 601, 602, 628, 765, 121 R, 500, 537, 158.1, 149, 688; 340/146.2, 531, 539, 635, 649, 653, 654, 660, 661, 662, 663, 664

(56) References Cited

U.S. PATENT DOCUMENTS

| | | | | |
|---|---|---|---|---|
| 3,657,669 A | * | 4/1972 | Proakis | 333/18 |
| 4,398,188 A | * | 8/1983 | Feigal et al. | 340/650 |
| 4,542,302 A | * | 9/1985 | Griffioen | 307/326 |
| 5,055,828 A | * | 10/1991 | Konigstein et al. | 340/664 |
| 6,094,042 A | * | 7/2000 | Whiteman | 324/72.5 |

* cited by examiner

*Primary Examiner*—Anjan Deb
*Assistant Examiner*—Donald M Lair

(57) ABSTRACT

A probe for connecting a device under test to a measurement device that corrects for dc errors and noise generated by the current flowing through the ground shield of a transmission line used by the probe. The probe identifies a voltage drop in the ground preferably using an additional line between the device under test and the measurement device. The signal provided to the measurement device is corrected based on the identified voltage drop.

1 Claim, 2 Drawing Sheets

APPARATUS AND METHOD FOR CANCELING DC ERRORS AND NOISE GENERATED BY GROUND SHIELD CURRENT IN A PROBE

BACKGROUND OF THE INVENTION

A probe is a device that ideally non-invasively connects a measurement device to a device under test (also referred to as a "DUT"). Known measurement devices, that utilize probes, include: oscilloscopes; spectrum analyzers; network analyzers; logic analyzers; counters; and time interval meters. In such known measurement devices, minimally invasive probes are connected to an indeterminate source of a signal to be tested and a ground of a DUT. To function in a minimally invasive manner, a probe has high impedance relative to the source impedance such that the probe does not add a significant load to the circuit under test. This feature separates probes from standard interconnects, such as used by power supplies and the like.

Active probes are a class of probes that contain active circuits, typically designed to provide impedance buffering near the probe tip to drive a 50 ohm transmission line to the measurement equipment One example of such an active probe is the AGILENT 1158A which is a 4 GHz Active probe for the AGILENT INFINIIUM oscilloscope. Active probes generally comprise three parts: a probe pod with circuits powered by the measuring device; the probe tip for interfacing with the DUT; and a transmission line between the probe tip and pod typically comprising a coax line with one or more single line wires.

A reoccurring problem with probes are dc errors and noise generated by the current flowing through the ground shield of the transmission line used by the probe. Such problems, especially at DC or low frequencies (such as 60 Hz), can be significant. Most probes include instructions for manually checking for these effects by grounding the probe tip and ground tip to the DUT ground to give the user an understanding of the level of these problems.

Various techniques have been used in the past to minimize the ground shield noise. For example, it is known to connect the DUT to an AC supply as close as possible to the measurement equipment. However, this is not always practical and may not limit the current enough for cutting edge measurement equipment. Another solution has been to insert a choke (inductor) into the power line ground of either the DUT or the measurement equipment so as to limit the current flow into the ground. This solution has not proven satisfactory at low frequencies and is not effective at all for DC. One solution that may help for DC is the use of a heavy conductor for the transmission line, unfortunately this solution has not been successful for low frequency signals. One solution that actually works is to float either the DUT or the measurement equipment by cutting the power ground line. Unfortunately, such a solution is quite dangerous.

The present inventors have discovered an apparatus and method for automatically compensating for noise caused by currents flowing in the transmission line ground of a probe.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
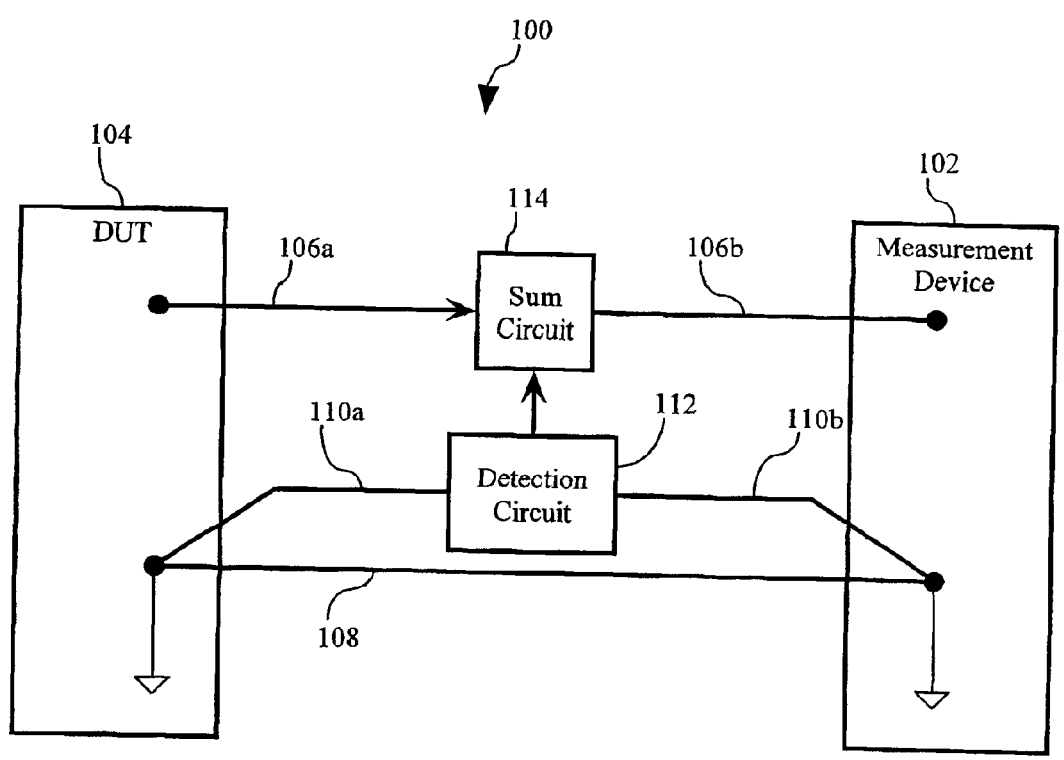
FIG. 1 is a simplified block diagram including a probe in accordance with a preferred embodiment of the present invention.

Reference will now be made in detail to the present invention, examples of which are illustrated in the accompanying drawings, wherein like reference numerals refer to like elements throughout.

FIG. 1 is a simplified block diagram of a circuit 100 in accordance with the preferred embodiment of the present invention. It will be appreciated by those of ordinary skill in the relevant arts that the circuit 100, as illustrated in FIG. 1, and the operation thereof as described hereinafter is intended to be generally representative such systems and that any particular system may differ significantly from that shown in FIG. 1, particularly in the details of construction and operation of such system. As such, the circuit 100 is to be regarded as illustrative and exemplary and not limiting as regards the invention described herein or the claims attached hereto.

The circuit 100 generally comprises a measuring device 102 connected to a DUT 104. In accordance with the preferred embodiment of the present invention, the measuring device 102 may be an oscilloscope, such as an AGILENT INFINIIUM. The DUT 104 could comprise any number of devices, including PC mother boards, high speed digital circuits, cellular phone circuits, etc . . . The measurement device 102 is generally connected to the DUT 104 via a signal wire 106 (comprising portions 106a and 106b) and a ground wire 108. An additional wire 110 (comprising portions 110a and 110b), carrying very low current, is provided between the measurement device 102 and the DUT 104.

A detection circuit 112 is interposed on the additional wire 110. More specifically, a first portion 110a of the wire 110 connects the ground of the DUT 104 to a detection circuit 112, while a second portion 110b of the wire 110 connects the detection circuit 112 to the ground of the measurement device 102. The detection circuit 112 detects a voltage difference between the ground of the Measurement device 102 and the ground of the DUT 104 and outputs a signal proportional to the detected difference.

A summing circuit 114 is similarly interposed on the signal wire 106. More specifically, a first portion 106a of the signal wire 106 connects the probe tip to an input of the summing circuit 114 while a second portion 106b of the signal wire 106 connects the measurement device 102 to an output of the summing circuit 114. A second input of the summing circuit 114 is connected to the output of the detection circuit 112. The summing circuit 114 outputs a signal proportional to the sum of the voltages on the first and second inputs thereof, e.g. the output of the detection circuit 112 and the signal measured on the DUT 104 via the signal wire 106a.

In operation, the detection circuit 112 senses the voltage drop due to the current flowing on the ground shield of the ground wire 108 which the sum circuit 114, in effect, subtracts from the signal voltage. In this manner the EMF generated on the shield of the ground wire 108 does not interfere with the operation of the measurement device 102.

Figure 2:
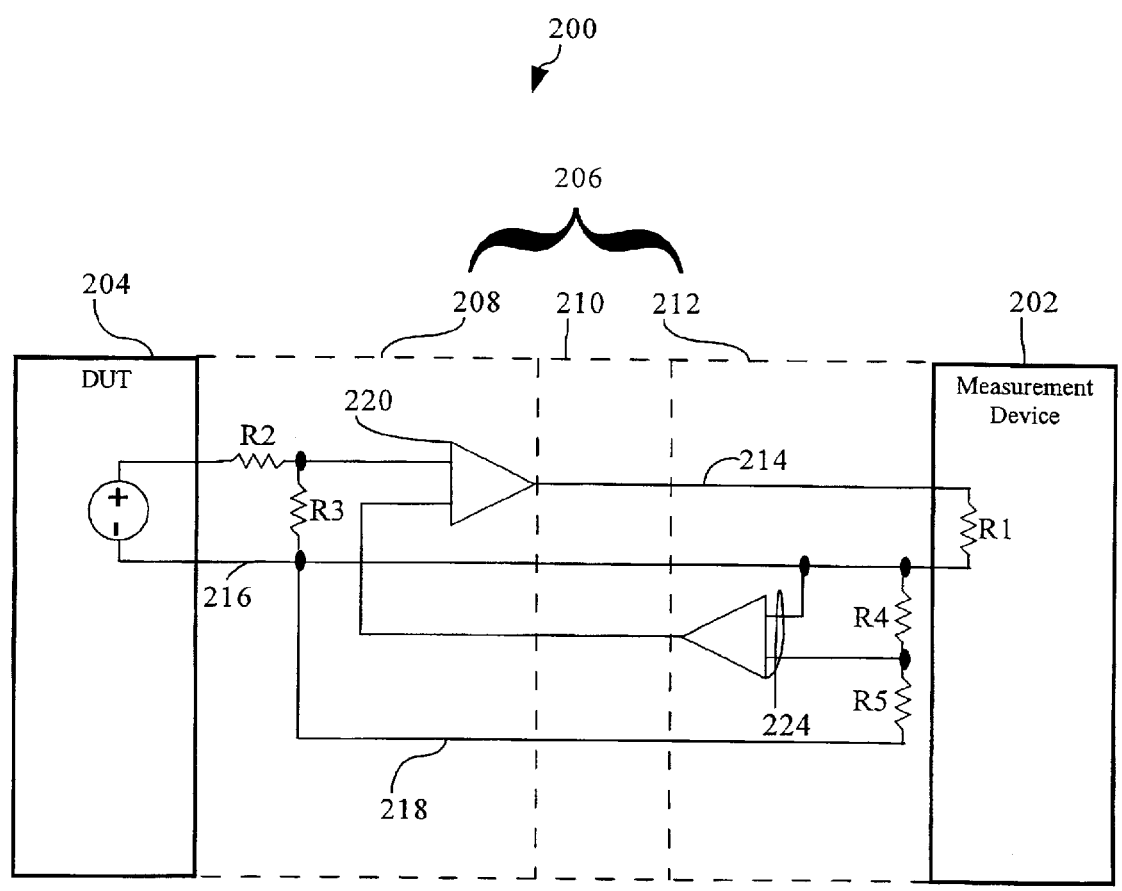
FIG. 2 is circuit diagram of a circuit including a probe in accordance with the preferred embodiment of the present invention.

FIG. 2 is circuit diagram of probe in accordance with the preferred embodiment of the present invention. It will be appreciated by those of ordinary skill in the relevant arts that the circuit 200, as illustrated in FIG. 2, and the operation thereof as described hereinafter is intended to be generally representative such systems and that any particular system may differ significantly from that shown in FIG. 2, particularly in the details of construction and operation of such system. As such, the circuit 200 is to be regarded as illustrative and exemplary and not limiting as regards the invention described herein or the claims attached hereto.

The circuit 200 generally comprises a measuring device 202 connected to a DUT 204 by a probe 206. In accordance with the preferred embodiment of the present invention, the measuring device 102 may be an oscilloscope, such as an AGILENT INFINIIUM. The DUT 204 could comprise any number of devices, including PC mother boards, high speed digital circuits, cellular phone circuits, etc . . . The probe 206 comprises a probe tip 208; a cable 210; and an electronics pod 212. The measurement device 202 is connected to the DUT 204 via a signal wire 214 and a ground wire 216 in the probe 206. An additional wire 218, carrying very low current, is provided between the measurement device 202 and the DUT 204. Those of ordinary skill in the art will recognize that only the components necessary for an understanding of the present invention are represented in FIG. 2. For example, other signal processing electronics are present in the pod and the tip.

In the example shown in FIG. 2 taking the voltage signal of the DUT 204 to be 1v and the voltage on the ground wire 216 to be 0.1v, the voltage of the signal measured exiting the DUT 204 would be 1.1v with out the corrective action of the present invention. With R2 and R5 set at 90 k ohm and R3 and R4 set at 10 k ohm the signal entering high frequency buffer amp 220 would be at 0.11v. The voltage between the amp 220 and the amp 224 (with a gain set to 1), e.g. the correction voltage, would be 0.01v. The voltage seen on the measurement device 202, across R1, would be 0.1v (as opposed to 0.11v which it would otherwise measure).

Although a few embodiments of the present invention has been shown and described, it would be appreciated by those skilled in the art that changes may be made in these embodiments without departing from the principles and spirit of the invention, the scope of which is defined in the claims and their equivalents.

What is claimed is:

1. A probe for connecting a device under test to a measurement device, the probe comprising:

a ground wire for connecting a ground on the device under test to a ground on the measurement device;

a first circuit that outputs a compensation signal representing the difference between a first and a second input;

a first additional wire that connects the ground of the device under test to the first input of the first circuit;

a second additional wire that connects the ground of the measurement device to the second input of the first circuit; and a second circuit that receives the compensation signal and a test signal from the device under test and outputs a signal proportional to the difference between the test signal and the compensation signal to the measurement device.

* * * * *